(12) United States Patent
Biwa

(10) Patent No.: US 11,486,560 B2
(45) Date of Patent: Nov. 1, 2022

(54) DISPLAY UNIT AND ILLUMINATION UNIT

(71) Applicant: SONY GROUP CORPORATION, Tokyo (JP)

(72) Inventor: Goshi Biwa, Tokyo (JP)

(73) Assignee: SONY GROUP CORPORATION, Tokyo (JP)

(*) Notice: Subject to any disclaimer, the term of this patent is extended or adjusted under 35 U.S.C. 154(b) by 0 days.

(21) Appl. No.: 17/284,164

(22) PCT Filed: Oct. 3, 2019

(86) PCT No.: PCT/JP2019/039141
§ 371 (c)(1),
(2) Date: Apr. 9, 2021

(87) PCT Pub. No.: WO2020/085032
PCT Pub. Date: Apr. 30, 2020

(65) Prior Publication Data
US 2021/0332966 A1 Oct. 28, 2021

(30) Foreign Application Priority Data
Oct. 24, 2018 (JP) .............................. JP2018-199873

(51) Int. Cl.
*F21V 9/32* (2018.01)
*H01L 25/075* (2006.01)
(Continued)

(52) U.S. Cl.
CPC ............ *F21V 9/32* (2018.02); *H01L 25/0753* (2013.01); *F21Y 2113/13* (2016.08); *F21Y 2115/10* (2016.08); *H01L 33/32* (2013.01)

(58) Field of Classification Search
CPC ....... F21V 9/32; H01L 25/0753; H01L 33/32; F21Y 2115/10; F21Y 2113/13
See application file for complete search history.

(56) References Cited

U.S. PATENT DOCUMENTS

2008/0285268 A1   11/2008   Oku et al.
2011/0222277 A1*  9/2011    Negley .................. H01L 33/504
                                                                 362/235
(Continued)

FOREIGN PATENT DOCUMENTS

CN    104064658    9/2014
JP    H10-190067   7/1998
(Continued)

OTHER PUBLICATIONS

International Search Report prepared by the Japan Patent Office dated Dec. 10, 2019, for International Application No. PCT/JP2019/039141.

Primary Examiner — Tsion Tumebo
(74) Attorney, Agent, or Firm — Sheridan Ross P.C.

(57) ABSTRACT

A display unit including: a plurality of first light emitting regions from which a first color light is to be extracted; a plurality of second light emitting regions from which a color light different from the first color light is to be extracted; a first light emitting device provided in each of the plurality of first light emitting regions and emitting the first color light; a second light emitting device provided in each of the plurality of second light emitting regions and emitting the first color light having a wavelength variation greater than a wavelength variation of the first color light to be emitted from the first light emitting device; and a wavelength converter provided in the second light emitting regions and converting a wavelength of the first color light emitted from the second light emitting device.

20 Claims, 7 Drawing Sheets

(51) Int. Cl.
*F21Y 113/13* (2016.01)
*F21Y 115/10* (2016.01)
*H01L 33/32* (2010.01)

(56) References Cited

U.S. PATENT DOCUMENTS

| | | | |
|---|---|---|---|
| 2013/0075769 A1* | 3/2013 | Yan | F21K 9/60 257/89 |
| 2014/0367633 A1 | 12/2014 | Bibl et al. | |
| 2016/0366746 A1* | 12/2016 | van de Ven | H05B 45/20 |
| 2017/0236866 A1 | 8/2017 | Lee et al. | |
| 2018/0047325 A1* | 2/2018 | Biwa | G09G 3/32 |

FOREIGN PATENT DOCUMENTS

| | | |
|---|---|---|
| JP | 2002-217454 | 8/2002 |
| JP | 2006-133708 | 5/2006 |
| JP | 2016-523450 | 8/2016 |

\* cited by examiner

DISPLAY UNIT AND ILLUMINATION UNIT

CROSS REFERENCE TO RELATED APPLICATIONS

This application is a national stage application under 35 U.S.C. 371 and claims the benefit of PCT Application No. PCT/JP2019/039141 having an international filing date of 3 Oct. 2019, which designated the United States, which PCT application claimed the benefit of Japanese Patent Application No. 2018-199873 filed 24 Oct. 2018, the entire disclosures of each of which are incorporated herein by reference.

TECHNICAL FIELD

The present technology relates to a display unit and an illumination unit each including a light emitting device and a wavelength converter.

BACKGROUND ART

Display units of a self-luminous type that use light emitting devices such as light emitting diodes (LEDs: Light Emitting Diodes) have been developed (see, for example, Patent Literature 1). For example, by using an LED that emits light in a blue wavelength range and a wavelength converter, it is possible to extract light in a red wavelength range, light in a green wavelength range, and the light in the blue wavelength range. The LEDs are also used in illumination units.

CITATION LIST

Patent Literature

Patent Literature 1: Japanese Unexamined Patent Application Publication No. 2002-217454

SUMMARY OF THE INVENTION

Regarding such display units and illumination units, it is desired to improve the quality of a display state or illumination state.

Therefore, it is desirable to provide a display unit and an illumination unit that make it possible to improve the quality of the display state or illumination state.

A display unit according to one embodiment of the present technology includes: a plurality of first light emitting regions from which a first color light is to be extracted; a plurality of second light emitting regions from which a color light different from the first color light is to be extracted; a first light emitting device provided in each of the plurality of first light emitting regions and emitting the first color light; a second light emitting device provided in each of the plurality of second light emitting regions and emitting the first color light having a wavelength variation greater than a wavelength variation of the first color light to be emitted from the first light emitting device; and a wavelength converter provided in the second light emitting regions and converting a wavelength of the first color light emitted from the second light emitting device.

An illumination unit according to one embodiment of the present technology includes: a plurality of first light emitting regions from which a first color light is to be extracted; a plurality of second light emitting regions from which a color light different from the first color light is to be extracted; a first light emitting device provided in each of the plurality of first light emitting regions and emitting the first color light; a second light emitting device provided in each of the plurality of second light emitting regions and emitting the first color light having a wavelength variation greater than a wavelength variation of the first color light to be emitted from the first light emitting device; and a wavelength converter provided in the second light emitting regions and converting a wavelength of the first color light emitted from the second light emitting device.

In the display unit or the illumination unit according to the embodiment of the present technology, the wavelength variation of the first color light to be emitted from the second light emitting device is greater than the wavelength variation of the first color light to be emitted from the first light emitting device. In other words, the wavelength variation of the first color light to be emitted from the first light emitting device is smaller than the wavelength variation of the first color light to be emitted from the second light emitting device. In the first light emitting region in which the first light emitting device is provided, the first color light is to be extracted without being subjected to wavelength conversion. By providing the first light emitting device in the first light emitting region, the wavelength variation of the first color light is less recognizable visually.

Figure 2:
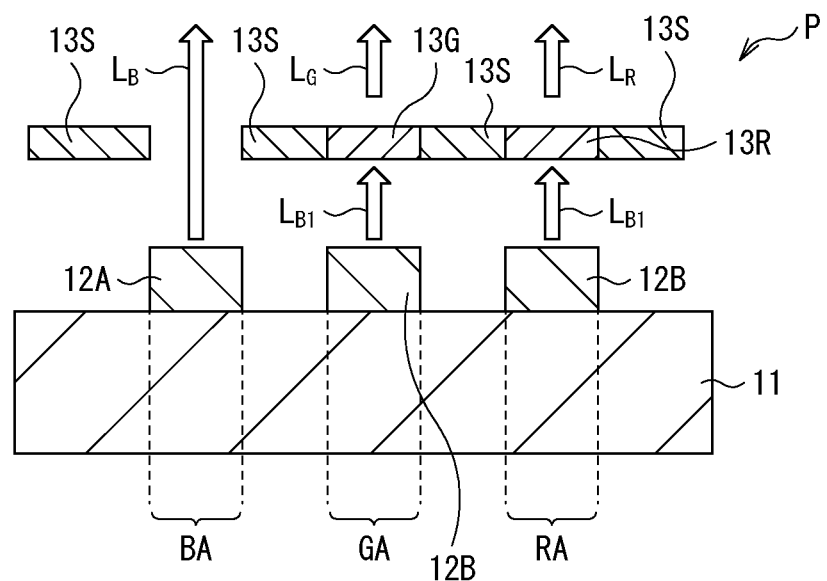
FIG. 2 is a schematic diagram illustrating an example of a configuration of one pixel of the display unit illustrated in FIG. 1.
Figure 4:
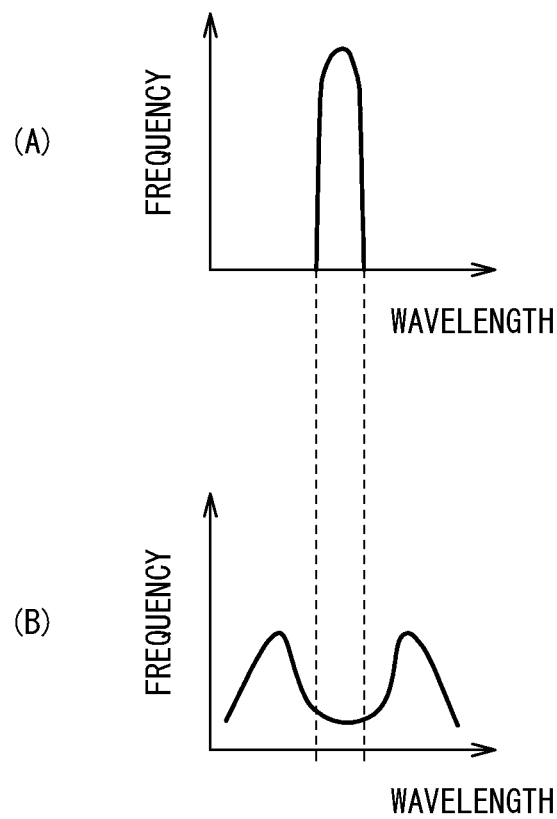

(A) of FIG. 4 is a schematic diagram illustrating a relationship between a dominant wavelength and a frequency for a light emitting device provided in a blue light emitting region illustrated in FIG. 2, and (B) of FIG. 4 is a schematic diagram illustrating a relationship between a dominant wavelength and a frequency for a light emitting device provided in each of a red light emitting region and a green light emitting region illustrated in FIG. 2.

Figure 5:
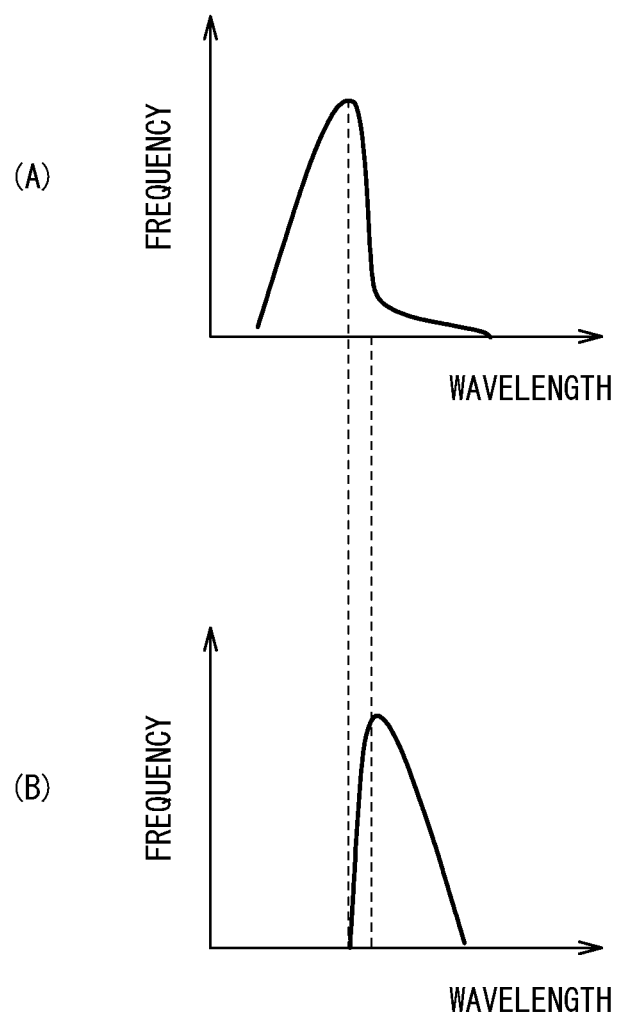

(A) of FIG. 5 is a schematic diagram illustrating an example of the relationship between the dominant wavelength and the frequency for the light emitting device provided in the green light emitting region, and (B) of FIG. 5 is a schematic diagram illustrating an example of the relationship between the dominant wavelength and the frequency for the light emitting device provided in the red light emitting region.

Figure 6:
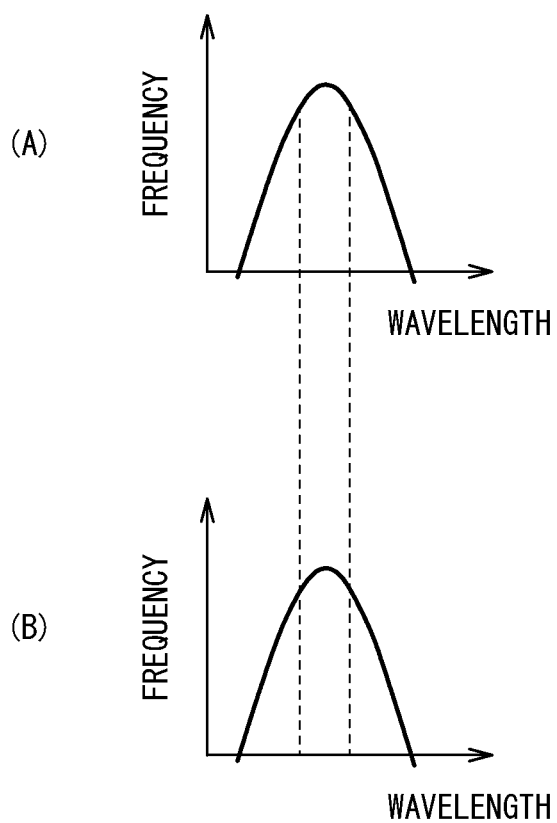

(A) of FIG. 6 is a schematic diagram illustrating a relationship between a dominant wavelength and a frequency for a light emitting device provided in a blue light emitting region of a display unit to a comparative example, and (B) of FIG. 6 is a schematic diagram illustrating a relationship between a dominant wavelength and a frequency for a light emitting device provided in each of a red light emitting region and a green light emitting region thereof.

Figure 7:
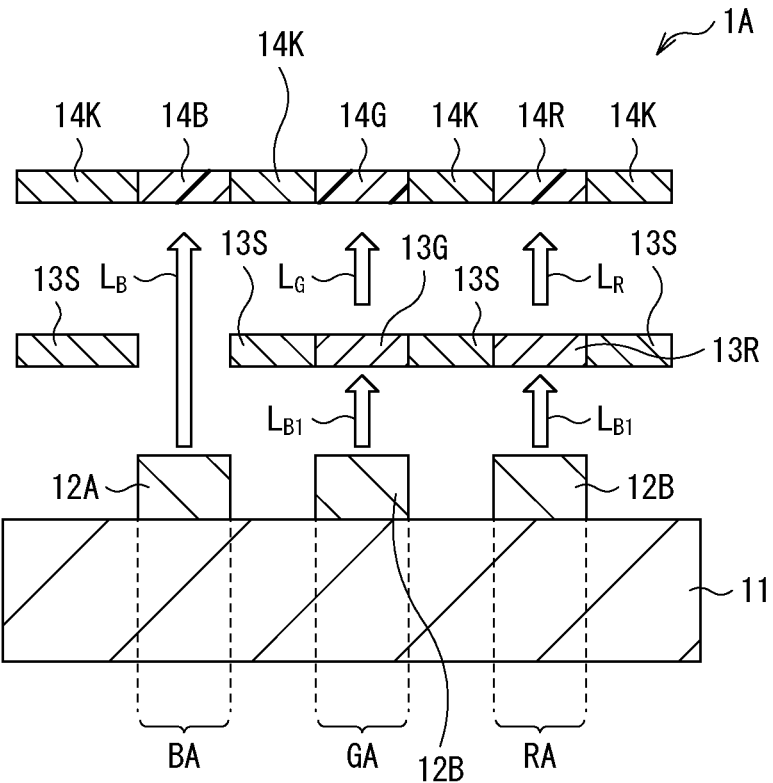

FIG. 7 is a schematic diagram illustrating a configuration of a main part of a display unit according to Modification Example 1.

Figure 8:
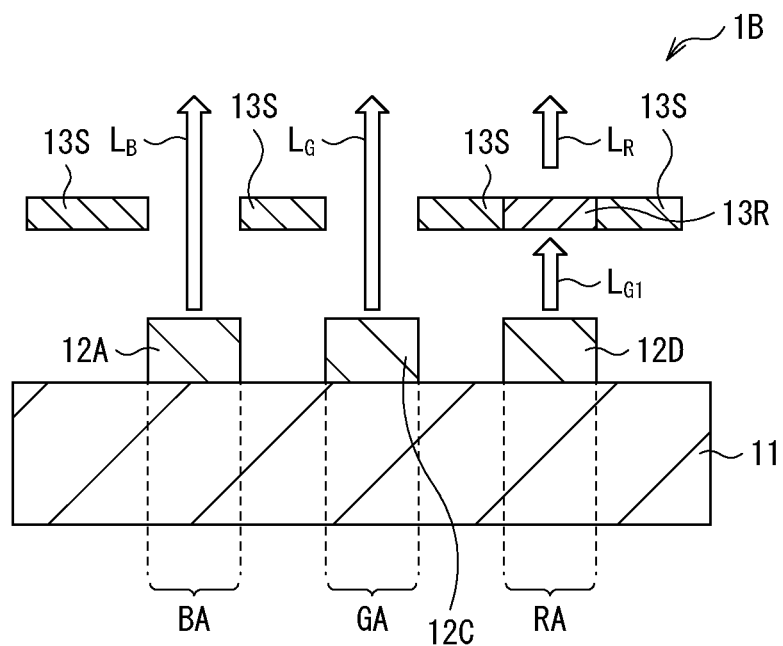

FIG. 8 is a schematic diagram illustrating a configuration of a main part of a display unit according to Modification Example 2.

Figure 1:
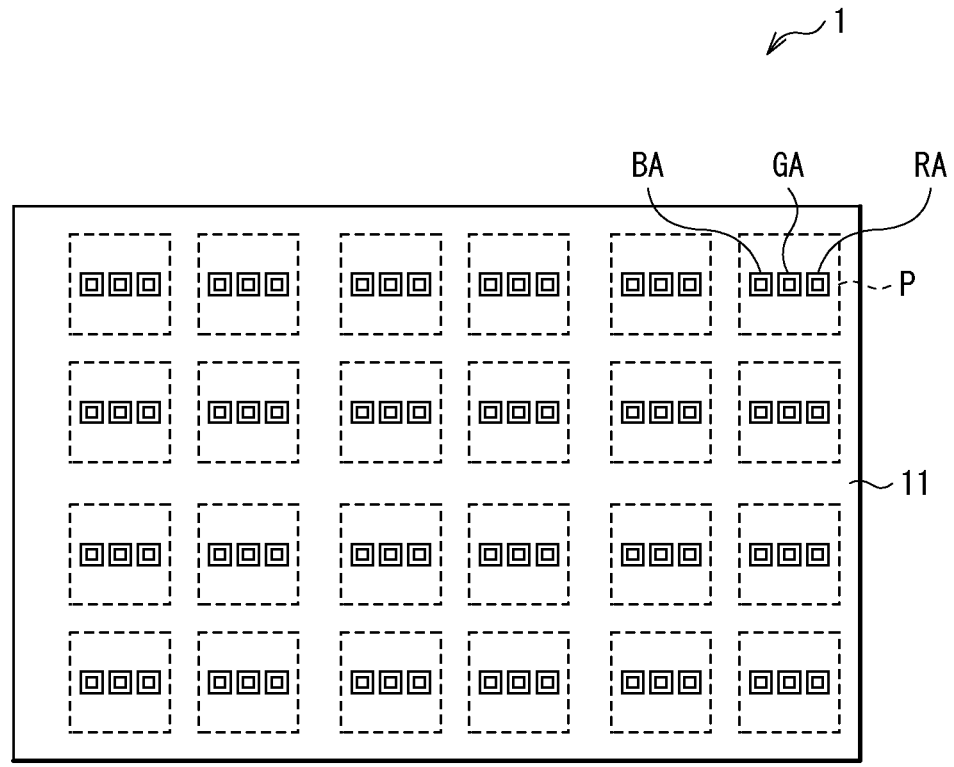
FIG. 1 is a schematic diagram illustrating an outline configuration of a display unit according to one embodiment of the present technology.
Figure 9:
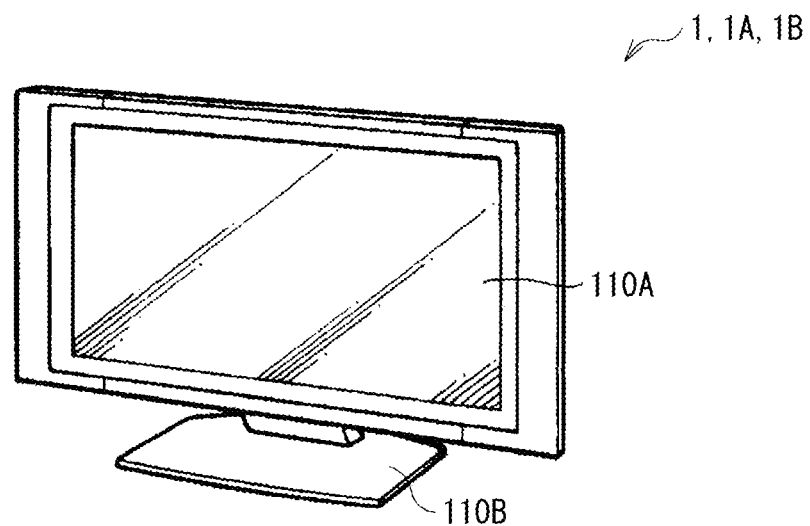

FIG. 9 is a perspective diagram illustrating an example of an appearance of a television apparatus to which the display unit illustrated in FIG. 1, etc. is applied.

Figure 10:
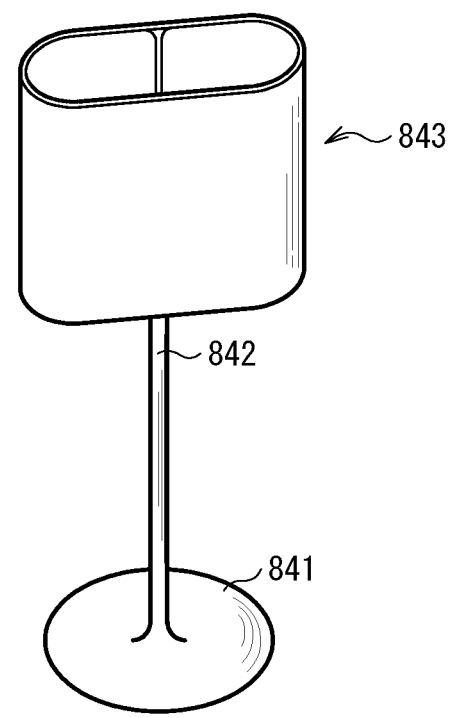

FIG. 10 is a perspective diagram illustrating an example of an appearance of general lighting to which the present technology is applied.

Figure 11:
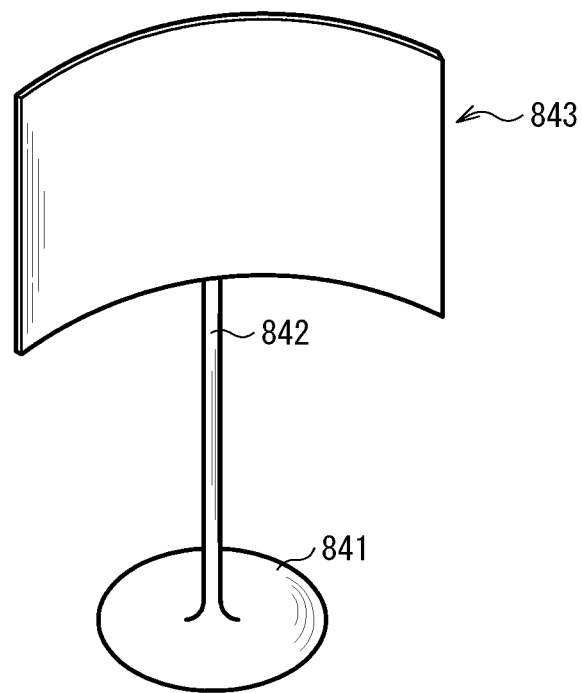

FIG. 11 is a perspective diagram illustrating another example (1) of the general lighting illustrated in FIG. 10.

Figure 12:
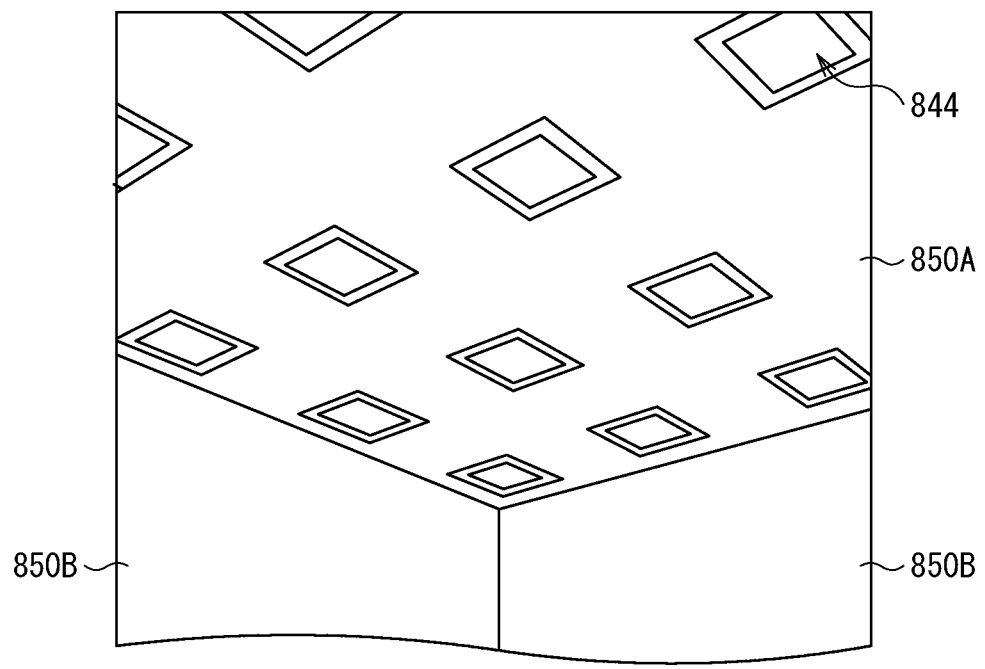

FIG. 12 is a perspective diagram illustrating another example (2) of the general lighting illustrated in FIG. 10.

MODES FOR CARRYING OUT THE INVENTION

In the following, an embodiment of the present technology will be described in detail with reference to the drawings. It is to be noted that the description is given in the following order.

1. Embodiment (a display unit including a first light emitting device and a second light emitting device that is greater in wavelength variation than the first light emitting device)
2. Modification Example 1 (an example with a color filter)
3. Modification Example 2 (an example in which the first light emitting device emits light in a green wavelength range)
4. Application Examples (a television apparatus and an illumination unit)

Embodiment (Configuration of Display Unit 1)

FIG. 1 schematically illustrates an overall configuration of a display unit (a display unit 1) according to one embodiment of the present technology. In this display unit 1, for example, a plurality of pixels P is provided on a substrate 11. The plurality of pixels P is arranged in a matrix, for example. Each pixel P is provided with, for example, a red light emitting region RA, a green light emitting region GA, and a blue light emitting region BA. That is, on the substrate 11, there are provided a plurality of the red light emitting regions RA, a plurality of the green light emitting regions GA, and a plurality of the blue light emitting regions BA.

FIG. 2 schematically illustrates a configuration of a main part of one pixel P. In the blue light emitting region BA, a light emitting device 12A is provided on the substrate 11. In the green light emitting region GA, a light emitting device 12B and a wavelength converter 13G are provided in this order on the substrate 11. In the red light emitting region RA, a light emitting device 12B and a wavelength converter 13R are provided in this order on the substrate 11. Here, the blue light emitting region BA corresponds to one specific example of the first light emitting region of the present technology, and the green light emitting region GA and the red light emitting region RA each correspond to one specific example of the second light emitting region of the present technology. The green light emitting region GA also corresponds to one specific example of a short-wavelength light emitting region of the present technology, and the red light emitting region RA also corresponds to one specific example of a long-wavelength light emitting region of the present technology. Further, the light emitting device 12A corresponds to one specific example of a first light emitting device of the present technology, and the light emitting device 12B corresponds to one specific example of a second light emitting device of the present technology.

In the blue light emitting region BA, light in a blue wavelength range (a blue light $L_B$) emitted from the light emitting device 12A is to be extracted as it is. In the green light emitting region GA, light in the blue wavelength range (a blue light $L_{B1}$) emitted from the light emitting device 12B is to enter the wavelength converter 13G to be subjected to wavelength conversion, whereby light in the green wavelength range (a green light $L_G$) is to be extracted. In the red light emitting region RA, the light in the blue wavelength range (the blue light $L_{B1}$) emitted from the light emitting device 12B is to enter the wavelength converter 13R to be subjected to wavelength conversion, whereby light in a red wavelength range (a red light $L_R$) is to be extracted. Here, the blue lights $L_B$ and $L_{B1}$ correspond to one specific example of a first color light of the present technology, the green light $L_G$ corresponds to one specific example of a second color light of the present technology, and the red light $L_R$ corresponds to one specific example of a third color light of the present technology.

In the following, a configuration of each part will be described.

The substrate 11 is for mounting the light emitting devices 12A and 12B thereon, and is configured by a glass substrate or a resin substrate, for example. A wiring layer (not illustrated) for driving the light emitting device 12A and 12B, for example, is provided between the substrate 11 and the light emitting devices 12A and 12B.

The light emitting devices 12A and 12B are configured by an LED, for example. The light emitting devices 12A and 12B include, for example, a semiconductor layer, an n-type electrode, and a p-type electrode. The light emitting devices 12A and 12B include a gallium nitride (GaN)-based semiconductor material, for example. Examples of the GaN-based semiconductor material include AlGaInN (aluminum gallium indium nitride). As described above, the light emitting device 12A provided in the blue light emitting region BA emits the blue light $L_B$, and the light emitting devices 12B provided in the green light emitting region GA and the red light emitting region RA emit the blue lights $L_{B1}$.

In the present embodiment, a wavelength variation of the blue light $L_{B1}$ to be emitted by the light emitting device 12B provided in each of the plurality of green light emitting regions GA and the plurality of red light emitting regions RA is greater than a wavelength variation of the blue light $L_B$ to be emitted by the light emitting device 12A provided in each of the plurality of blue light emitting regions BA. In other words, the wavelength variation of the blue light $L_B$ to be emitted by the light emitting device 12A provided in each of the plurality of blue light emitting regions BA is smaller than the wavelength variation of the blue light $L_{B1}$ to be emitted by the light emitting device 12B provided in each of the plurality of green light emitting regions GA and the plurality of red light emitting regions RA. As will be described in more detail later, this causes the wavelength variation of the blue light $L_B$ extracted from the blue light emitting region BA to be less recognizable visually, thus making it possible to improve the quality of the display state.

Specifically, a standard deviation (a standard deviation $S_A$) of a dominant wavelength (dominant wavelength) of the blue light $L_B$ to be emitted by each of a plurality of light emitting devices 12A is smaller than a standard deviation (a standard deviation $S_B$) of a dominant wavelength of the blue light $L_{B1}$ to be emitted by each of a plurality of light emitting devices 12B ($S_A < S_B$).

Figure 3:
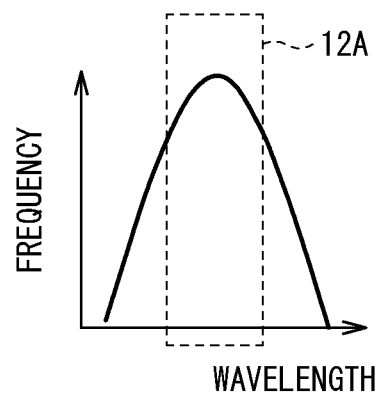
FIG. 3 is a schematic diagram illustrating an example of a relationship between a dominant wavelength and a frequency for a plurality of light emitting devices in an unsorted state.

FIG. 3 schematically illustrates, regarding the plurality of light emitting devices in an unsorted state (a mixture of the light emitting devices 12A and 12B), a relationship between a dominant wavelength and a frequency of the blue light to be emitted. (A) of FIG. 4 schematically illustrates a relationship between the dominant wavelength and the frequency of the blue light $L_B$ to be emitted by each of the plurality of light emitting devices 12A, and (B) of FIG. 4 schematically illustrates a relationship between the dominant wavelength and the frequency of the blue light $L_{B1}$ to be emitted by each of the plurality of light emitting devices 12B. In this way, by sorting out the light emitting devices (the light emitting devices 12A) that emit light in a specific wavelength range (for example, on the order of 461 nm to 463 nm) from the light emitting devices in the unsorted state, it is possible to obtain the plurality of light emitting devices 12A that emit light (the blue light $L_B$) having a small wavelength variation, as illustrated in (A) of FIG. 4. The standard deviation $S_A$ of the dominant wavelength of the blue light $L_B$ to be emitted by each of the plurality of light emitting devices 12A is, for example, on the order of 0.2 nm to 0.4 nm. After the plurality of light emitting devices 12A are extracted, the remaining light emitting devices in the unsorted state constitute the plurality of light emitting devices 12B. For example, there are present both the light emitting device 12B having a dominant wavelength on a short-wavelength side of the specific wavelength range described above and the light emitting device 12B having a dominant wavelength on a long-wavelength side of the specific wavelength range. The standard deviation $S_B$ of the dominant wavelength of the blue light $L_{B1}$ to be emitted by each of the plurality of light emitting devices 12B is, for example, on the order of 1 nm to 3 nm. Verification or the like of whether or not the plurality of light emitting devices 12A are intentionally sorted ones is possible by a statistical significance test, for example.

(A) and (B) of FIG. 5 illustrate other examples of the relationship between the dominant wavelength and the frequency of the blue light $L_{B1}$ to be emitted by each of the plurality of light emitting devices 12B. (A) of FIG. 5 illustrates the relationship between the dominant wavelength and the frequency of the blue light $L_{B1}$ to be emitted by the light emitting device 12B provided in each of the plurality of green light emitting regions GA. (B) of FIG. 5 illustrates the relationship between the dominant wavelength and the frequency of the blue light $L_{B1}$ to be emitted by the light emitting device 12B provided in each of the plurality of red light emitting regions RA. As described above, an average wavelength of the blue light $L_{B1}$ to be emitted by the light emitting device 12B disposed in each of the plurality of green light emitting regions GA and an average wavelength of the blue light $L_{B1}$ to be emitted by the light emitting device 12B disposed in each of the plurality of red light emitting regions RA may be different from each other. As illustrated in (A) and (B) of FIG. 5, it is preferable that the average wavelength of the blue light $L_{B1}$ to be emitted by the light emitting device 12B disposed in each of the plurality of green light emitting regions GA be shorter than the average wavelength of the blue light $L_{B1}$ to be emitted by the light emitting device 12B disposed in each of the plurality of red light emitting regions RA. This makes it possible to increase conversion efficiency at the wavelength converter 13G (for example, Han, Hau-Vei & Lin et al., Optics Express. 23. 32504.10.1364/OE. 23. 032504 (2015)), and to increase efficiency of light emission including color conversion. It is to be noted that the wavelength converter 13R also has a tendency to be improved in conversion efficiency by the blue light $L_{B1}$ in the wavelength range on the short-wavelength side; however, this tendency is more noticeable for the wavelength converter 13G than for the wavelength converter 13R. Therefore, it is possible to effectively improve conversion efficiency by disposing the light emitting device 12B that emits the blue light $L_{B1}$ on the shorter-wavelength side in the green light emitting region GA.

It is to be noted that when manufacturing a plurality of display units 1, the relationship between the average wavelength of the blue light $L_{B1}$ to be emitted by the light emitting device 12B provided in the green light emitting region GA and the average wavelength of the blue light $L_{B1}$ to be emitted by the light emitting device 12B provided in the red light emitting region RA may be reversed between different display units 1. The average wavelength of the light emitting devices 12B provided in each of the green light emitting regions GA and the red light emitting regions RA is statistically determinable by measurement of a dominant wavelength of an aggregate of some of them, and thus an average wavelength may not be measured for the light emitting devices 12B provided in all of the pixels P.

The wavelength converters 13R and 13G are provided on a light extraction side of the light emitting devices 12B. The wavelength converter 13R provided in the red light emitting region RA absorbs the blue light $L_{B1}$ emitted from the light emitting device 12B and emits the red light $L_R$. The wavelength converter 13G provided in the green light emitting region GA absorbs the blue light $L_{B1}$ emitted from the light emitting device 12B and emits the green light $L_G$. The wavelength converters 13R and 13G each include, for example, a phosphor material, a nanophosphor material, a quantum dot (QD: Quantum Dot), a quantum disk, a quantum rod, or the like. The wavelength converters 13R and 13G perform wavelength conversion using, for example, absorption and emission by the quantum effect. A light-blocking section 13S is provided between the wavelength converter 13R and the wavelength converter 13G. The light-blocking section 13S includes, for example, a metal material, a resin material, or the like, and blocks the blue lights $L_B$ and $L_{B1}$. Providing the light-blocking section 13S makes it possible to suppress traveling of the blue lights $L_B$ and $L_{B1}$ across the red light emitting region RA, the green light emitting region GA, and the blue light emitting region BA.

(Operation of Display Unit 1)

In the display unit 1, for example, a drive signal is inputted to each of the pixels P (the red light emitting region RA, the green light emitting region GA, and the blue light emitting region BA) via the wiring layer. In the red light emitting region RA, the blue light $L_{B1}$ is emitted from the light emitting device 12B. This blue light $L_{B1}$ enters the wavelength converter 13R, and the red light $L_R$ is extracted. In the green light emitting region GA, the blue light $L_{B1}$ is emitted from the light emitting device 12B. This blue light $L_{B1}$ enters the wavelength converter 13G, and the green light $L_G$ is extracted. In the blue light emitting region BA, the blue light $L_B$ emitted from the light emitting device 12A is extracted as it is.

(Workings and Effects of Display Unit 1)

In the display unit 1 of the present embodiment, the wavelength variation of the blue light $L_{B1}$ to be emitted by the light emitting device 12B provided in each of the red light emitting region RA and the green light emitting region GA is greater than the wavelength variation of the blue light $L_B$ to be emitted by the light emitting device 12A provided in the blue light emitting region BA. In other words, the wavelength variation of the blue light $L_B$ to be emitted by the light emitting device 12A is smaller than the wavelength variation of the blue light $L_{B1}$ to be emitted by the light emitting device 12B. This makes it possible to improve the quality of the display state, that is, display quality. In the following, the workings and effects will be described using a comparative example.

(A) and (B) of FIG. 6 each illustrate a relationship between a dominant wavelength and a frequency of a blue light to be emitted by a plurality of light emitting devices provided in a display unit of the comparative example. (A) of FIG. 6 illustrates the relationship between the dominant wavelength and the frequency of the blue light to be emitted by the light emitting device (corresponding to the light emitting device 12A in FIG. 2) provided in each of the blue light emitting regions. (B) of FIG. 6 illustrates the relationship between the dominant wavelength and the frequency of the blue light to be emitted by the light emitting device (corresponding to the light emitting device 12B in FIG. 2) provided in each of the red light emitting regions and the green light emitting regions.

In this display unit, as illustrated in (A) and (B) of FIG. 6, a standard deviation of the dominant wavelength of the blue light to be emitted by the light emitting device provided in each of the blue light emitting regions and a standard deviation of the dominant wavelength of the blue light to be emitted by the light emitting device provided in each of the red light emitting regions and the green light emitting regions are substantially the same. The light emitting devices in the unsorted state, i.e., in a state with manufacturing variations, have great wavelength variations. For example, the dominant wavelengths of the light emitting devices vary by about 440 nm to 470 nm. In the display unit according to the comparative example, the light emitting device provided in the blue light emitting region also has such a wavelength variation of the dominant wavelength. That is, the blue light having the wavelength variation is extracted as it is without being subjected to wavelength conversion. As a result, the wavelength variation of the blue light is visually recognized as color unevenness as it is, thus degrading the display quality.

Regarding a plurality of LEDs used for backlight of a liquid crystal display, a method of reducing a difference between wavelengths of lights emitted from the respective LEDs has been reported (for example, see Japanese Unexamined Patent Application Publication No. 2017-108184). However, this method is for solving a problem specific to the backlight, and is therefore not applicable to the display unit according to the comparative example described above.

For example, a method is conceivable in which a light emitting device to emit a red light is disposed in the red light emitting region, a light emitting device to emit a green light is disposed in the green light emitting region, and a light emitting device to emit a blue light is disposed in the blue light emitting region. However, manufacturing the light emitting device to emit the red light and manufacturing the light emitting devices to emit the green light and the blue light use different crystal materials, and therefore such a method involves different manufacturing apparatuses for the different crystal materials. Furthermore, the crystal material to be used for the light emitting device to emit the green light and the crystal material to be used for the light emitting device to emit the blue light are also different in composition, which involves method optimization and manufacturing control for each of the light emitting devices. As a result, the manufacturing cost increases. Further, such a method narrows the design width of the color to be emitted and the color purity for the light emitting device to emit each color light.

Further, a method is conceivable in which a light emitting device to emit ultraviolet (UV: Ultra Violet) light is disposed in each of the red light emitting region, the green light emitting region, and the blue light emitting region to be subjected to wavelength conversion. However, this method results in a large energy loss because of the use of ultraviolet light of high energy. Further, peripheral members of the light emitting devices, the wavelength converters, etc. are greatly degraded due to entry of the ultraviolet light.

In contrast, in the display unit 1, a light emitting device (the light emitting device 12A) having a dominant wavelength in a specific wavelength range is sorted out from a state with manufacturing variations and is disposed in each of the plurality of blue light emitting regions BA. As a result, the blue light $L_B$ to be extracted from the blue light emitting region BA is smaller in wavelength variation as compared with the blue light $L_{B1}$ to be emitted by the light emitting devices 12B disposed in the red light emitting regions RA and the green light emitting regions GA. Therefore, the wavelength variation of the blue light $L_B$ is less recognizable visually as compared with the display unit of the comparative example described above. That is, it is possible to suppress degradation of display quality resulting from color unevenness.

Further, after the plurality of light emitting devices 12A are sorted out from the state with manufacturing variations as described above, it is possible for the remaining light emitting devices to constitute the light emitting devices 12B to be disposed in the red light emitting regions RA and the green light emitting regions GA. That is, it is possible to suppress a waste of the light emitting devices. In the red light emitting regions RA and the green light emitting regions GA, even in a case where the wavelength variations of the blue lights $L_{B1}$ to be emitted by the light emitting devices 12B are relatively great, their influence on the display quality is small. One reason for this is as follows.

In the red light emitting regions RA and the green light emitting regions GA, the blue lights $L_{B1}$ emitted by the light emitting devices 12B are subjected to wavelength conversion at the wavelength converters 13R and 13G. That is, the wavelength converters 13R and 13G have a greater influence on the wavelengths of the red light $L_R$ and the green light $L_G$ to be extracted from the red light emitting regions RA and the green light emitting regions GA than the light emitting devices 12B. This makes it possible to suppress wavelength variations of the red light $L_R$ and the green light $L_G$ even in the case where the wavelength variations of the blue lights $L_{B1}$ to be emitted by the light emitting devices 12B are relatively great. In the display unit 1, it is therefore possible to suppress the manufacturing cost while suppressing deterioration of display quality.

Further, the light emitting devices 12A and 12B disposed in the red light emitting regions RA, the green light emitting regions GA, and the blue light emitting regions BA are all to emit light in the blue wavelength range (the blue lights $L_B$ and $L_{B1}$). It is therefore possible to use the same crystal material, manufacturing apparatus, manufacturing conditions, and the like when manufacturing the light emitting devices 12A and 12B. This allows for reduction of manufacturing cost. Furthermore, the wavelengths and color purity of the red light $L_R$ and the green light $L_G$ are easily adjustable by the wavelength converters 13R and 13G. This makes it possible to improve the design flexibility for the wavelengths and color purity of the red light $L_R$ and the green light $L_G$.

Further, as compared with the case where the light emitting devices emit ultraviolet light, energy loss is lower, and also degradation of the peripheral members of the light emitting devices 12A and 12B, the wavelength converters 13R and 13G, etc. is suppressed.

In this way, in the present embodiment, the blue lights $L_{B1}$ to be emitted by the light emitting devices 12B have a greater wavelength variation than the wavelength variation of the blue light $L_B$ to be emitted by the light emitting device 12A. This allows the wavelength variation of the blue light $L_B$ to be less recognizable visually. As a result, it is possible to improve the quality of the display state.

Further, because the blue lights $L_{B1}$ are subjected to wavelength conversion at the wavelength converters 13R and 13G, the wavelength variations of the blue lights $L_{B1}$ are adjustable by the wavelength converters 13R and 13G. Therefore, the light emitting devices 12B may have relatively great manufacturing variations, and this makes it possible to keep the manufacturing cost low.

In the following, modification examples of the embodiment described above will be described. In the following description, the same components as those of the embodiment described above are denoted with the same reference numerals, and the description thereof will be omitted as appropriate.

Modification Example 1

FIG. 7 schematically illustrates a display unit (a display unit 1A) according to Modification Example 1 of the embodiment described above. The display unit 1A has color filters 14R and 14G on the light extraction side of the wavelength converters 13R and 13G, respectively. Except for this point, the display unit 1A according to Modification Example 1 has a configuration and effects similar to those of the display unit 1 of the embodiment described above.

The color filter 14R is provided in the red light emitting region RA. The color filter 14R selectively transmits light in the red wavelength range. The color filter 14G is provided in the green light emitting region GA. The color filter 14G selectively transmits light in the green wavelength range.

A color filter 14B may be provided in the blue light emitting region BA. The color filter 14B is disposed on the light extraction side of the light emitting device 12A, and selectively transmits light in the blue wavelength range. A black matrix 14K, for example, is provided between every adjacent two of the color filters 14R, 14G, and 14B.

As in the present modification example, the color filters 14R, 14G, and 14B may be provided. In this case also, it is possible to obtain an effect equivalent to that of the embodiment described above. Further, even if the blue light $L_{B1}$ that has failed to be fully absorbed by the wavelength converter 13G or 13R is mixed into the green light $L_G$ or the red light $L_R$, the color filter 14R or 14G removes the blue light $L_{B1}$. The display unit 1A thus makes it possible to improve the color purity.

Modification Example 2

FIG. 8 schematically illustrates a configuration of a main part of a display unit (a display unit 1B) according to Modification Example 2 of the embodiment described above. In the display unit 1B, light emitting devices (light emitting devices 12C and 12D) that emit lights in the green wavelength range (green lights $L_G$ and $L_{G1}$) are provided in the green light emitting region GA and the red light emitting region RA. Here, the light emitting device 12C corresponds to one specific example of the first light emitting device of the present technology, and the light emitting device 12D corresponds to one specific example of the second light emitting device of the present technology. Further, the green light corresponds to one specific example of the first color light of the present technology. Except for this point, the display unit 1B according to Modification Example 2 has a configuration and effects similar to those of the display unit 1 of the embodiment described above.

The light emitting device 12C is provided in each of the plurality of green light emitting regions GA. The light emitting device 12C is to emit the green light $L_G$. No wavelength converter is provided in any of the green light emitting regions GA, and the green light $L_G$ is to be extracted from each of the plurality of green light emitting regions GA.

The light emitting device 12D is provided in each of the plurality of red light emitting regions RA. The light emitting device 12D emits the green light $L_{G1}$ that is greater in wavelength variation than the green light $L_G$ that the light emitting device 12C emits. The wavelength converter 13R is provided on the light extraction side of the light emitting device 12D. In the red light emitting region RA, the green light $L_{G1}$ emitted from the light emitting device 12D enters the wavelength converter 13R and is subjected to wavelength conversion into a red light $L_R$. The red light $L_R$ is to be extracted from each of the plurality of red light emitting regions RA.

The light emitting device 12A is provided in each of the plurality of blue light emitting regions BA, and the blue light $L_B$ is to be extracted from each of the plurality of blue light emitting regions BA.

In the present modification example, the wavelength variation of the green light $L_{G1}$ to be emitted from the light emitting device 12D provided in each of the plurality of red light emitting regions RA is greater than the wavelength variation of the green light $L_G$ to be emitted from the light emitting device 12C provided in each of the plurality of green light emitting regions GA. In this case also, it is possible to obtain an effect equivalent to that of the embodiment described above. In the display unit 1B, the light emitting device 12B (see FIG. 2) emitting the blue light $L_{B1}$ may be provided in each of the red light emitting regions RA.

In the following, application examples of the display unit 1 as described above to an electronic apparatus will be described. Examples of the electronic apparatus include a television apparatus, a digital camera, a notebook personal computer, a portable terminal apparatus such as a mobile phone, and a video camera. In other words, it is possible to apply the display unit 1 described above to an electronic apparatus in any field that displays, as an image or a picture, a picture signal inputted externally or a picture signal generated internally.

Application Example 1

FIG. 9 illustrates an appearance of a flat-screen television apparatus to which the display unit described above (any of the display units 1, 1A, and 1B) is applied. This television apparatus has a configuration in which a flat plate-shaped body 110A for image display is supported by a stand 110B. It is to be noted that, while the television apparatus is to be used as a stationary type by being placed on a horizontal surface such as a floor, a shelf, or a table in a state in which the stand 110B is attached to the body 110A, it is also possible for the television apparatus to be used as a wall-hanging type in a state in which the stand 110B is detached from the body 110A.

Application Example 2

FIG. 10 illustrates an appearance of general lighting to which the present technology is applied. This general lighting is tabletop lighting provided with the present technology described in the above embodiment and the like. For example, an illumination section 843 is attached to a support 842 provided on a base 841. The illumination section 843 is configured by the present technology described in the above embodiment and the like. It is possible to provide the illumination section 843 with any shape such as a hollow cylinder shape illustrated in FIG. 10 or a curved-plane shape illustrated in FIG. 11 by providing a light guide plate 20 with a curved shape.

The present technology described in the above embodiments and the like may be applied to general lighting for indoor use as illustrated in FIG. 12. In this general lighting, an illumination section 844 is configured by the illumination unit according to the above embodiment or the like. An appropriate number of illumination sections 844 are disposed at appropriate intervals on a ceiling 850A of a building. It is to be noted that the illumination section 844 is installable not only on the ceiling 850A but also at any location depending on intended use, such as on a wall 850B or on a floor (not illustrated).

In such general lighting, illumination is performed by the lights emitted from the light emitting devices 12A, 12B, 12C, and 12D. Here, as has been described in the above embodiment and the like, the lights (the blue light $L_B$ and the green light $L_G$) to be emitted from the light emitting devices 12A and 12C are small in wavelength variation, and therefore it is possible to improve the quality of illumination state.

Although the present technology has been described above with reference to the embodiment and the modification examples, the present technology is not limited to the embodiment and the like, and is modifiable in various ways. For example, the material and thickness of each part described in the above embodiment and the like are non-limiting, and other materials and thicknesses may be used.

Any of the display units 1, 1A, and 1B described in the above embodiment and the like may be a display unit including a plurality of substrates 11 arranged in a tiled manner, that is, a so-called tiling display. In this case, it is possible to improve the display quality more effectively by, for example, reducing a difference between the dominant wavelengths of blue lights LB (or green lights LG) to be emitted by the respective light emitting devices 12A (or light emitting devices 12C) provided on adjacent substrates 11 to a small value (for example, 2 nm or less).

Further, in the above embodiment and the like, description has been given of the case where the display unit 1, 1A, or 1B, or the illumination unit is provided with the red light emitting regions RA, the green light emitting regions GA, and the blue light emitting regions BA; however, the display unit 1, 1A, or 1B, or the illumination unit may include a region from which light in another wavelength range is to be extracted. For example, a region (a yellow light emitting region) from which light in a yellow wavelength range is to be extracted may be provided in the display unit 1, 1A, or 1B, or the illumination unit. In the yellow light emitting region, for example, provided are the light emitting device 12B that emits the blue light $L_{B1}$ and a wavelength converter that absorbs the blue light $L_{B1}$ to convert the blue light $L_{B1}$ into the light in the yellow wavelength range. Further, for example, a region (an infrared light emitting region) from which light in the infrared wavelength range is to be extracted may be provided in the illumination unit for surgery or the like. In the infrared light emitting region, for example, a light emitting device and a wavelength converter are provided. By providing the infrared light emitting region, it is possible to improve inspection sensitivity, for example. Alternately, any of the blue lights $L_B$ and $L_{B1}$ and the green lights $L_G$ and $L_{G1}$ that the light emitting devices 12A, 12B, 12C, and 12D emit may be light in any of other wavelengths, and a light emitting device that emits light in a shorter wavelength range, for example, may be used in the display unit 1, 1A, or 1B, or the illumination unit.

Note that the effects described in this specification are merely exemplary and non-limiting, and any other effects may be achieved.

It is to be noted that the present technology may also be configured as below. According to the display unit and the illumination unit of one embodiment of the present technology having the following configuration, the wavelength variation of the first color light to be emitted from the second light emitting device is made greater than the wavelength variation of the first color light to be emitted from the first light emitting device. This allows the wavelength variation of the first color light to be less recognizable visually. Accordingly, it is possible to improve the quality of the display state or the illumination state.

(1)

A display unit including:

a plurality of first light emitting regions from which a first color light is to be extracted;

a plurality of second light emitting regions from which a color light different from the first color light is to be extracted;

a first light emitting device provided in each of the plurality of first light emitting regions and emitting the first color light;

a second light emitting device provided in each of the plurality of second light emitting regions and emitting the first color light having a wavelength variation greater than a wavelength variation of the first color light to be emitted from the first light emitting device; and a wavelength converter provided in the second light emitting regions and converting a wavelength of the first color light emitted from the second light emitting device.

(2)

The display unit according to (1), in which the first color light is a blue light.

(3)

The display unit according to (1) or (2), in which the plurality of second light emitting regions include a plurality of short-wavelength light emitting regions from which a second color light is to be extracted, and a plurality of long-wavelength light emitting regions from which a third color light having a wavelength longer than a wavelength of the second color light is to be extracted.

(4)

The display unit according to (3), in which the second color light is a green light, and the third color light is a red light.

(5)

The display unit according to (3) or (4), in which an average wavelength of the first color light to be emitted from the second light emitting device provided in each of the plurality of short-wavelength light emitting regions is shorter than an average wavelength of the first color light to be emitted from the second light emitting device provided in each of the plurality of long-wavelength light emitting regions.

(6)

The display unit according to (1), in which the first color light is a green light.

(7)

The display unit according to any one of (1) to (6), further including a color filter that is provided in at least the plurality of second light emitting regions and transmits a light in a selective wavelength range.

(8)

The display unit according to any one of (1) to (7), in which the wavelength converter includes a phosphor material, a nanophosphor material, a quantum dot, a quantum disk, or a quantum rod.

(9)

The display unit according to any one of (1) to (8), in which the first light emitting device and the second light emitting device are configured by a light emitting diode.

(10)

The display unit according to (9), in which the light emitting diode includes a gallium nitride-based semiconductor material.

(11)

An illumination unit including:
a plurality of first light emitting regions from which a first color light is to be extracted;
a plurality of second light emitting regions from which a color light different from the first color light is to be extracted;
a first light emitting device provided in each of the plurality of first light emitting regions and emitting the first color light;
a second light emitting device provided in each of the plurality of second light emitting regions and emitting the first color light having a wavelength variation greater than a wavelength variation of the first color light to be emitted from the first light emitting device; and
a wavelength converter provided in the second light emitting regions and converting a wavelength of the first color light emitted from the second light emitting device.

This application claims priority from Japanese Patent Application No. 2018-199873 filed on Oct. 24, 2018 with the Japan Patent Office, the entire contents of which are incorporated in the present application by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. A display unit, comprising:
a plurality of first light emitting regions from which a first color light is extracted;
a plurality of second light emitting regions from which a color light different from the first color light is extracted;
a first light emitting device provided in each of the plurality of first light emitting regions and emitting the first color light;
a second light emitting device provided in each of the plurality of second light emitting regions and emitting a variation of the first color light,
wherein the variation of the first color light has a wavelength variation greater than a wavelength variation of the first color light emitted from the first light emitting device; and
a wavelength converter provided in the second light emitting regions and converting a wavelength of the variation of the first color light emitted from the second light emitting device, and
wherein the variation of the first color light having a wavelength variation greater than the wavelength variation of the first color light emitted from the first light emitting device is measured before the variation of the first color light enters the wavelength converter.

2. The display unit according to claim 1, wherein the first color light is a blue light.

3. The display unit according to claim 1, wherein the plurality of second light emitting regions include a plurality of short-wavelength light emitting regions from which a second color light is extracted, and a plurality of long-wavelength light emitting regions from which a third color light having a wavelength longer than a wavelength of the second color light is extracted.

4. The display unit according to claim 3, wherein the second color light is a green light, and the third color light is a red light.

5. The display unit according to claim 3, wherein an average wavelength of the variation of the first color light emitted from the second light emitting device provided in each of the plurality of short-wavelength light emitting regions is shorter than an average wavelength of the variation of the first color light emitted from the second light emitting device provided in each of the plurality of long-wavelength light emitting regions.

6. The display unit according to claim 1, wherein the first color light is a green light.

7. The display unit according to claim 1, further comprising a color filter that is provided in at least the plurality of second light emitting regions and transmits a light in a selective wavelength range.

8. The display unit according to claim 1, wherein the wavelength converter includes a phosphor material, a nanophosphor material, a quantum dot, a quantum disk, or a quantum rod.

9. The display unit according to claim 1, wherein the first light emitting device and the second light emitting device are configured by a light emitting diode.

10. The display unit according to claim 9, wherein the light emitting diode includes a gallium nitride-based semiconductor material.

11. An illumination unit, comprising:
a plurality of first light emitting regions from which a first color light is extracted;
a plurality of second light emitting regions from which a color light different from the first color light is extracted;
a first light emitting device provided in each of the plurality of first light emitting regions and emitting the first color light;
a second light emitting device provided in each of the plurality of second light emitting regions and emitting a variation of the first color light, wherein the variation of the first color light has a wavelength variation greater than a wavelength variation of the first color light emitted from the first light emitting device; and a wavelength converter provided in the second light emitting regions and converting a wavelength of the variation of the first color light emitted from the second light emitting device, and wherein the variation of the first color light having a wavelength variation greater than the wavelength variation of the first color light emitted from the first light emitting device is measured before the variation of the first color light enters the wavelength converter.

12. The illumination unit according to claim 11, wherein the first color light is a blue light.

13. The illumination unit according to claim 11, wherein the plurality of second light emitting regions include a plurality of short-wavelength light emitting regions from which a second color light is extracted, and a plurality of long-wavelength light emitting regions from which a third color light having a wavelength longer than a wavelength of the second color light is extracted.

14. The illumination unit according to claim 13, wherein the second color light is a green light, and the third color light is a red light.

15. The illumination unit according to claim 13, wherein an average wavelength of the variation of the first color light emitted from the second light emitting device provided in each of the plurality of short-wavelength light emitting regions is shorter than an average wavelength of the variation of the first color light emitted from the second light emitting device provided in each of the plurality of long-wavelength light emitting regions.

16. The illumination unit according to claim 11, wherein the first color light is a green light.

17. The illumination unit according to claim 11, further comprising a color filter that is provided in at least the plurality of second light emitting regions and transmits a light in a selective wavelength range.

18. The illumination unit according to claim 11, wherein the wavelength converter includes a phosphor material, a nanophosphor material, a quantum dot, a quantum disk, or a quantum rod.

19. The illumination unit according to claim 11, wherein the first light emitting device and the second light emitting device are configured by a light emitting diode.

20. The illumination unit according to claim 19, wherein the light emitting diode includes a gallium nitride-based semiconductor material.

* * * * *